United States Patent
Zhou et al.

(10) Patent No.: US 12,027,213 B2
(45) Date of Patent: Jul. 2, 2024

(54) DETERMINING OFFSETS FOR MEMORY READ OPERATIONS

(71) Applicant: Micron Technology, Inc., Boise, ID (US)

(72) Inventors: Jie Zhou, Shanghai (CN); Xiangang Luo, Fremont, CA (US); Min Rui Ma, Shanghai (CN); Guang Hu, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/637,766

(22) PCT Filed: Mar. 19, 2021

(86) PCT No.: PCT/CN2021/081761
§ 371 (c)(1),
(2) Date: Feb. 23, 2022

(87) PCT Pub. No.: WO2022/193272
PCT Pub. Date: Sep. 22, 2022

(65) Prior Publication Data
US 2024/0120011 A1    Apr. 11, 2024

(51) Int. Cl.
*G11C 7/00*    (2006.01)
*G11C 16/26*    (2006.01)
(Continued)

(52) U.S. Cl.
CPC .............. *G11C 16/26* (2013.01); *G11C 29/028* (2013.01); *G11C 29/52* (2013.01)

(58) Field of Classification Search
CPC ....... G11C 7/1051; G11C 7/22; G11C 7/1072; G11C 7/1006; G11C 7/1066
(Continued)

(56) References Cited

U.S. PATENT DOCUMENTS 6,137,720 A * 10/2000 Lancaster .............. G11C 16/30
                                                    365/185.11
9,633,740 B1    4/2017 Alhussien et al.
(Continued)

FOREIGN PATENT DOCUMENTS

CN        111863098 A    10/2020

OTHER PUBLICATIONS

ISA/CN, "International Search Report and Written Opinion of the International Searching Authority," issued in connection with Int'l Appl. No. PCT/CN2021/081761, dated Dec. 14, 2021 (10 pages).

*Primary Examiner* — Son T Dinh
(74) *Attorney, Agent, or Firm* — Holland & Hart LLP

(57) ABSTRACT

Methods, systems, and devices for determining offsets for memory read operations are described. In response to a threshold quantity of pages failing initial reads but being successfully read using a same reference adjustment during re-reads, the offset responsible for the adjustment may be used as a first-applied offset for subsequent re-reads or a baseline offset for subsequent initial reads. After the initial reads begin using the reference adjustment, if a threshold quantity of pages fail initial reads, the offset used for the initial read may be adjusted to be the offset used to perform the successful re-reads. If an updated offset to use a baseline is not identified, the baseline offset may be cleared so the original reference may again be used without adjustment for initial reads.

25 Claims, 6 Drawing Sheets

(51) Int. Cl.
    *G11C 29/02*     (2006.01)
    *G11C 29/52*     (2006.01)

(58) Field of Classification Search
    USPC .................................. 365/189.15, 189.14
    See application file for complete search history.

(56) References Cited

U.S. PATENT DOCUMENTS

| | | |
|---|---|---|
| 2018/0033490 A1 | 2/2018 | Marelli et al. |
| 2018/0261296 A1 | 9/2018 | Choi et al. |
| 2020/0252079 A1 | 8/2020 | Wang et al. |

\* cited by examiner ously read multiple pages.
DETERMINING OFFSETS FOR MEMORY READ OPERATIONS

CROSS REFERENCE

The present Application for Patent is a 371 national phase filing of International Patent Application No. PCT/CN2021/081761 by Zhou et al., entitled "DETERMINING OFFSETS FOR MEMORY READ OPERATIONS," filed Mar. 19, 2021, assigned to the assignee hereof, and expressly incorporated by reference herein.

FIELD OF TECHNOLOGY

The following relates generally to one or more systems for memory and more specifically to determining offsets for memory read operations.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

To read a block of NAND memory, each of the pages of the block may be read, one after the other. For the initial read of a page, a reference voltage may be used. If an error (e.g., an error identified using a low-density parity check) is detected in the data during the initial read, the reference voltage may be adjusted by an offset and the page may be re-read using the adjusted reference voltage. The reference adjustment and re-reading of the page may be repeated until no error is detected. Then the process may be repeated for the next page.

Ideally, most pages of a block may be read successfully on an initial read of the page, rarely performing a re-read. But sometimes, for example due to temperature changes to the memory or deterioration of the memory, the quantity of re-reads used to successfully read pages may increase. In many of these cases, pages may go through multiple re-reads before the data may be successfully read even though the same reference adjustment may be used to successfully read the pages. This may be inefficient and time consuming. In effect, an lengthy process may be used to continually identify the same offset used to successfully read multiple pages. It may also lead to more wear on the memory cells.

Systems, devices, and techniques are described herein in which, in response to a threshold quantity of pages failing their initial reads but being successfully read using a same or similar offset to the reference voltage during re-reads, the offset responsible for the successful read operation may be used as a first-applied offset for subsequent re-reads or a baseline offset for subsequent initial reads. This may result in less re-reads being performed and/or more initial reads being successful, thereby saving time and power and wear on the memory cells.

After the initial reads begin using the baseline offset, the initial reads may be monitored for failures. If a threshold quantity of pages fail their initial reads, it may signify that the adjustment may no longer be adequate. If a threshold quantity of the failed pages are successfully read during re-reads using another reference adjustment, the offset responsible for the new adjustment may be used as a new baseline offset. If no such adjustment is found, the baseline offset may be cleared so that the original reference may again be used without adjustment for initial reads.

Figure 1:
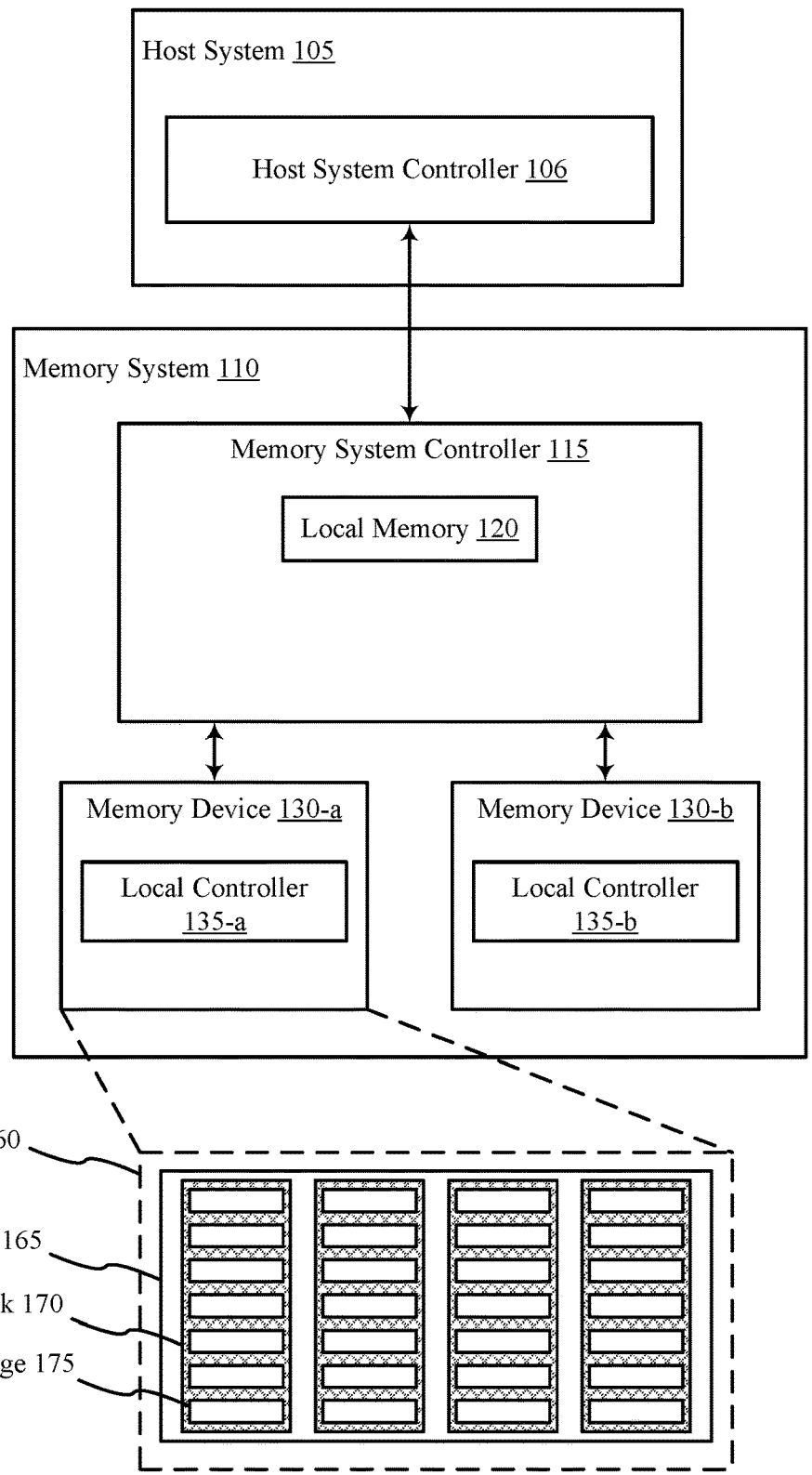
FIG. 1 illustrates an example of a system that supports determining offsets for memory read operations in accordance with examples as disclosed herein.

Features of the disclosure are initially described in the context of systems and devices with reference to FIG. 1. Features of the disclosure are further described in the context of distribution plots, devices, and a flowchart as described with reference to FIGS. 2-5. These and other features of the disclosure are further illustrated by and described in the context of an apparatus diagram and a flowchart that relate to determining offsets for memory read operations with reference to FIGS. 6-7.

FIG. 1 illustrates an example of a system 100 that supports determining offsets for memory read operations in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random-access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support determining offsets for memory read operations. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

Techniques are described for identifying a baseline offset to apply to a reference voltage for subsequent read operations. Sometimes pages of memory device may be affected similarly. For example, a temperature of the memory system 110 may cause the threshold voltages stored by the memory cells to shift in a similar manner. Sometimes such shifts may introduce errors into the data. To correct the errors, the data may be re-read using one or more offsets to the reference voltage. In some cases, the memory system 110 may identify when a threshold quantity of initial read operations fail (e.g., re-read operations using offsets are used). In such cases, the memory system 110 may identify a baseline or default offset to use for initial read operations in an effort to reduce a quantity of re-read operations that occur in the memory system.

Figure 2:
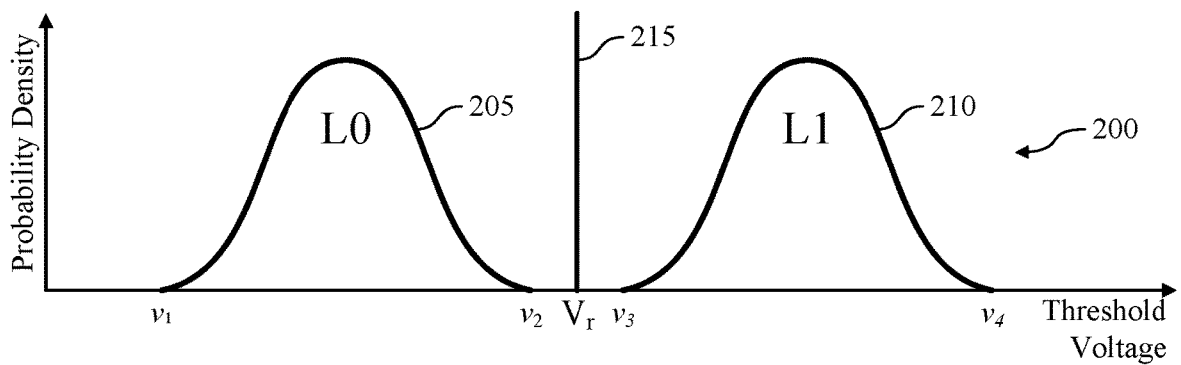
FIGS. 2, 3A, and 3B illustrate example distribution plots that support determining offsets for memory read operations in accordance with examples as disclosed herein.

FIG. 2 illustrates an example of a distribution plot 200 that supports determining offsets for memory read operations in accordance with examples as disclosed herein. The distribution plot 200 illustrates examples of a first voltage distribution (e.g. L0 distribution 205) that may be associated with a signal output by a memory cell storing a logic value '1' and a second voltage distribution (e.g. L1 distribution 210) that may be associated with a signal output by a memory cell storing a logic value '0.' The L0 distribution may be bounded by data threshold values v1 and v2, and the L1 distribution 210 may be bounded by data threshold values v3 and v4. The distribution plot 200 shows distributions for an SLC memory device. The principles described herein may be applied for memory devices that use MLC, TLC, QLC or other types of operations.

To reflect a data bit being stored, a memory cell's state (e.g., charge) may be programmed to a corresponding voltage level. For example, to program a memory cell to a logic 1 or 0 state, charge pulses may be applied to the memory cell during write operations using a first write voltage or a second write voltage, respectively. The first and second write voltages may be stored as trim parameters.

Ideally, the threshold voltages of a memory cell correspond to the write voltages. However, due to variation during programming, the threshold voltage of cells programmed to the same state may be distributed across a voltage window for the state. This may result in a threshold voltage distribution of memory cells across a voltage range for each state. For example, a cell storing a logic 1 may have a threshold voltage in the L0 voltage distribution 205 (i.e., between v1 and v2) and a cell storing a logic 0 may have a threshold voltage in the L1 voltage distribution 210 (i.e., between v3 and v4). L0 and L1 may be referred to as the states of the cells.

During a read operation of a memory cell, a charge of the memory cell may be compared with a reference voltage. For example, to determine the logic values stored by one or more memory cells, a memory device may apply a reference voltage 215 to the memory cells to read a page of data stored by the memory cells. For memory cells whose threshold voltage is above the reference voltage (e.g., to the right of reference voltage 215), current may flow from the memory cell after applying the reference voltage 215 to the memory cell, signifying a logic value '0'. In contrast, for memory cells having a charge below the reference voltage (e.g., to the left of reference voltage 215), current may not flow from the memory cell after applying the reference voltage 215 to the memory cell, signifying a logic value '1'. To make sure the memory cells are correctly read, the reference voltage 215 may be between the L0 distribution 205 and the L1 distribution 210 (e.g., between v2 and v3). The reference voltage may be stored as a trim parameter.

There may be times one or more of the voltage distributions of a memory cell may change, e.g., due to age, voltage spikes, temperature changes, etc. Either or both of the voltage distributions may expand, shift, etc. Because the signal value of the memory cell may be compared with a reference voltage (e.g., a static reference signal), the data represented by the memory cell may not be affected by the change as long as the voltage distributions corresponding to logic values '0' and '1' remain on opposite sides of the reference voltage. For example, voltage distribution 205 or 210 or both may shift and/or expand with respect to voltage without causing data problems if they both remain on opposite sides of reference voltage 215. But if any portion of either voltage distribution crosses over the reference voltage so as to be on the same side of the reference voltage line as the other voltage distribution, data errors may occur.

Figure 3A:
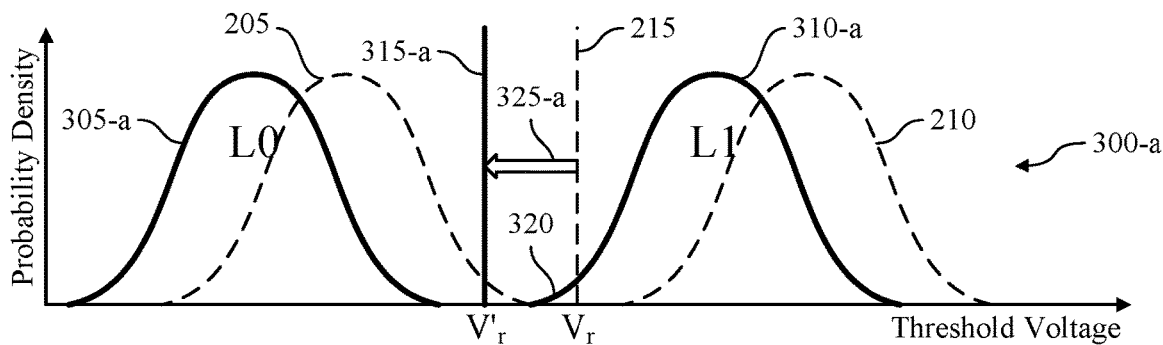
Figure 3B:
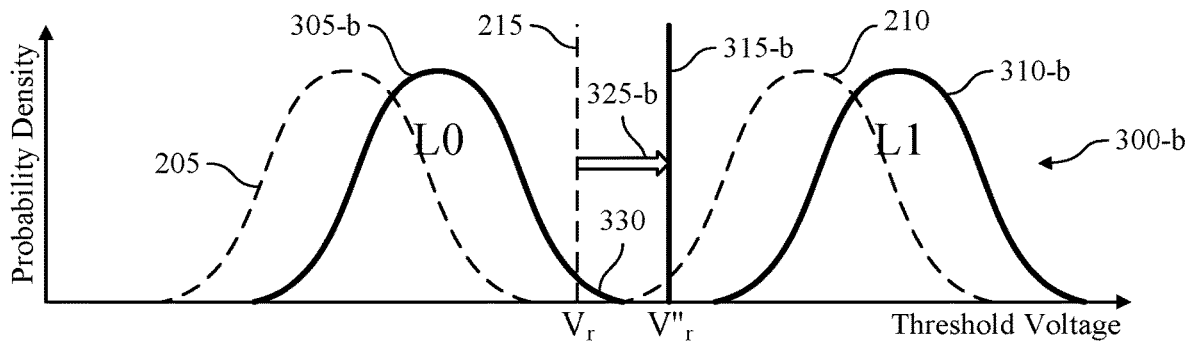

FIG. 3A-3B illustrate examples of distribution plots 300 (distribution plot 300-a and distribution plot 300-b) that support determining offsets for memory read operations in accordance with examples as disclosed herein. The distribution plots 300-a and 300-b illustrate examples in which the first or second voltage distributions may have shifted with respect to the voltage so that at least a portion of either voltage distribution has crossed over the reference voltage.

In FIG. 3A, voltage distribution 205 and voltage distribution 210 (shown in dashed lines) may have respectively shifted down in voltage to voltage distribution 305-a and voltage distribution 310-a. This may occur, e.g., in response to the temperature of the memory cells being different when read than when previously written. A portion 320 of the L1 distribution 310-a may be on the same side of reference voltage 215 (shown in dashed line) as the L0 distribution 305-a. As a result, a memory cell stored with a logic '0' may have a threshold voltage within the portion 320 of voltage distribution 310-a. If that memory cell is read using reference voltage 215, the memory system may erroneously determine that the memory cell represents a logic value '1' because the signal value is less than the reference voltage 215.

To correct the data error, the memory system may shift the reference voltage down. For example, reference voltage 215 may be shifted down to reference voltage 315-a (e.g., by an offset value 325-a) so that the portion 320 of the L1 distribution 310-a is no longer on the same side of the reference voltage as the L0 distribution 305-a. If reference voltage 315-a is then used during a read operation, the memory system may determine that any signal value within the L1 distribution 310-a (including the portion 320) represents a logic value '0'.

In FIG. 3B, voltage distribution 205 and voltage distribution 210 (shown in dashed lines) may have respectively shifted up in voltage to voltage distribution 305-b and voltage distribution 310-b. A portion 330 of the L0 distribution 305-b may be on the same side of reference voltage 215 (shown in dashed line) as the L1 distribution 310-b. As a result, a memory cell stored with a logic '1' may have a threshold voltage within the portion 330 of voltage distribution 305-b and may be erroneously read as a logic value '0' using reference voltage 215.

Similar to FIG. 3A, the memory system may shift the reference voltage to correct the data error. For example, reference voltage 315 may be shifted up to reference voltage 315-b (e.g., by an offset value 325-b) so that the portion 330 of the L0 distribution 305-b is no longer on the same side of the reference voltage as the L1 distribution 310-b. This may allow for any signal value within the L0 distribution 305-b (including the portion 330) to be read as a logic value '1' using reference voltage 315-b.

Figure 4:
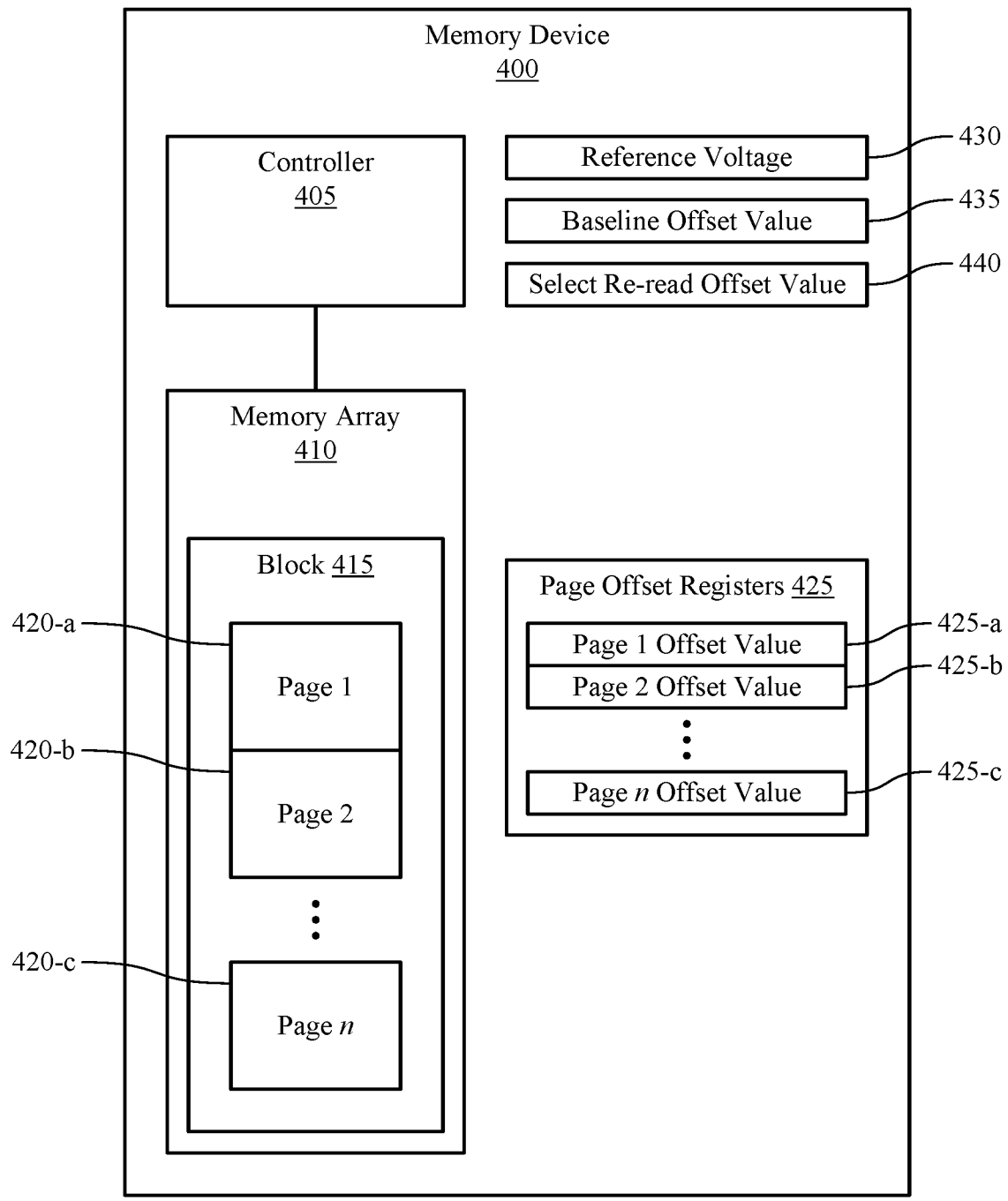
FIG. 4 illustrates an example of a memory device that supports determining offsets for memory read operations in accordance with examples as disclosed herein.

FIG. 4 illustrates an example of a memory device 400 that supports determining offsets for memory read operations in accordance with examples as disclosed herein. Memory device 400 may be an example of a memory device 130 discussed with reference to FIG. 1. Memory device 400 may include a controller 405 which may execute operations on a memory array 410 (e.g., a NAND memory array) of the memory device 400. Controller 405 may be an example of a local controller 135 discussed with reference to FIG. 1. Memory array 410 may include one or more blocks 415, each including a set of pages 420 (420-a, 420-b, 420-c). Each page 420 may include a set of memory cells.

To read a block of memory or a portion thereof, the controller 405 may perform read operations on the pages 420 of the block. To determine the logic values associated with each memory cell of a page 420, the controller 405 may perform an initial read that compares the charges of the memory cells to a reference voltage (e.g., reference voltage 215), as discussed with reference to FIG. 2. An indication of the value to use for the reference voltage may be stored in a reference voltage register 430.

Data returned from the page 420 during the initial read may be checked for errors (e.g., error correction code (ECC) errors, parity errors, etc.) before being sent to the host system. For example, a low-density parity check of the information retrieved from the page 420 may be performed as part of the initial read of the page 420. Other types of error checks may be used, including ECC checks. In some cases, the controller 405 may attempt to automatically correct the errors. If the errors are uncorrectable, a re-read of the page 420 may be performed by the controller 405 using an offset value. For example, controller 405 may re-read page 420-a by comparing the memory cells associated with the page to the reference voltage, shifted by an offset value (e.g., offset value 325-a or 325-b), as discussed with reference to FIGS. 3A and 3B. The data returned from the page 420 during the re-read may again be checked for errors and if the data still contains uncorrectable errors, the offset value may be adjusted and another re-read of the page may be performed using the reference voltage or the adjusted offset value or both. The offset adjustments and page re-reads may be repeated until no errors are detected in the data returned from page 420-a. The data may then be sent to the host system.

Indications of the offset values for the pages may be stored in a set of page offset registers 425 (425-a, 425-b, 425-c). Each page offset register 425 may be associated with a different page 420. For example, page offset registers 425-a, 425-b, and 425-c may be associated respectively with pages 420-a, 420-b, and 420-c. The page offset registers 425 may be located within the block 415 or at another portion of memory array 410 or memory device 400. The offset value to use for a particular page 420 (e.g., page 420-a) may be determined by the controller 405 based on the page offset register 425 associated with the page 420 (e.g., page offset register 425-a). In some cases, a page offset register 425 may be updated to reflect the adjusted offset value used to read the associated page.

Once data has been successfully read (e.g., with no errors) from a page 420 (either during an initial read or a re-read), the next page 420 may be read by the controller 405 in a similar manner, and this may be repeated until the desired pages 420 have been read. Each page 420 may be read using the same reference voltage, and, in some cases, may also use different offset values to shift the reference. For example, the reference voltage indicated by reference voltage register 430, may be used to read pages 420-a, 420-b, and 420-c, and if an offset is used, the offset value indicated by page offset registers 425-a, 425-b, and 425-c may also be respectively used.

In some cases, an offset may be used after an uncorrectable error has been detected in the associated page data. In those cases, the value indicated by the page offset register 425 (e.g., page offset register 425-a) may be used by the controller 405 for re-reads of the associated page (e.g., page 420-a) but not for initial reads of the page 420.

In other cases, the offset may also be used by the controller 405 for initial reads. For example, the page offset register 425 (e.g., page offset register 425-a) may be used to determine an offset value to use with the initial read of the corresponding page 420 (e.g., page 420-a). In some cases, one or more of the page offset registers 425 may be initialized to indicate a baseline offset value. For example, the page offset registers 425 may be initialized to indicate an offset value of zero so that the reference voltage may not be shifted for the initial read. In some cases, the page offset registers 425 may be initialized to indicate a non-zero baseline offset value.

An indication of the value to use for the baseline offset may be stored in a baseline offset register 435. In some cases, the indication may be copied to a page offset register 425 (e.g. page offset register 425-a) before the initial reading of the associated page 420 (e.g., page 420-a). Then, during the initially read of the page, the memory cells associated with the page may be compared to the reference voltage shifted by the baseline offset value indicated by the associated page offset register 425 (e.g. page offset register 425-a). In some cases, the baseline offset value indication may be copied to a set of page offset registers 425 so that the baseline offset value may be used for the initial reads of the pages 420 associated with the set. In some cases, baseline offset register 435 may be used instead of the page offset registers 425 for reading and re-reading of one or more pages 420.

In some cases, a select re-read offset value may be the first offset used to perform a first re-read of a page (i.e., after an error has been detected in the initial read). An indication of the select re-read offset value may be stored in a select re-read offset register 440. The indication may be copied to a page offset register 425 (e.g., page offset register 425-a) after uncorrectable data has been detected during the initial read of the associated page 420 (e.g., page 420-a). The select re-read offset value may be based on one or more prior offset values that were successfully used in prior re-reads. In some cases, the select re-read offset value may be updated after each successful re-read of a page. In some cases, the select re-read offset value may be equal to an offset value used to successfully read a prior page (e.g., an immediately prior page). In some cases, the baseline offset value may be based on the select re-read offset value.

Figure 5:
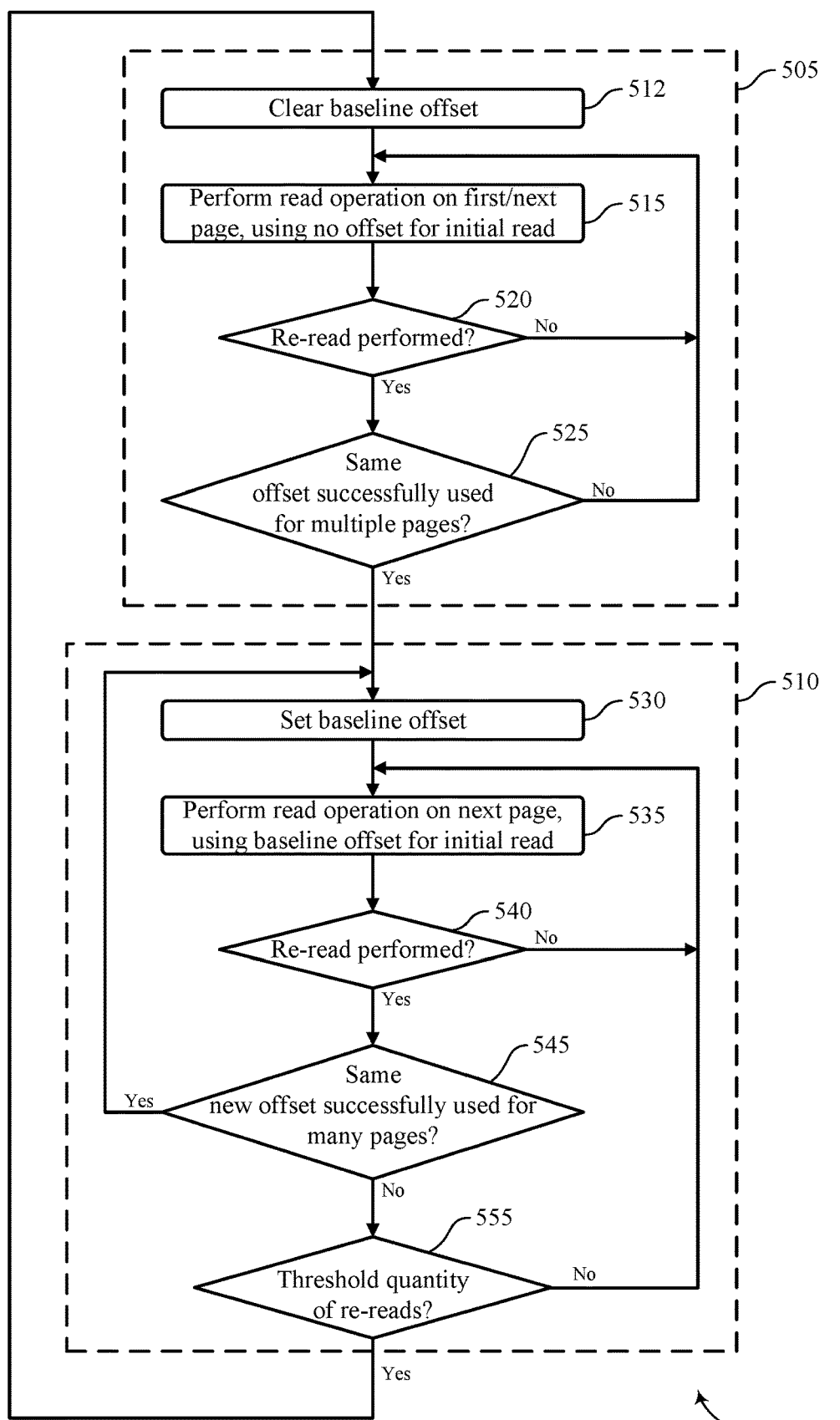
FIG. 5 illustrates a flow diagram illustrating a method that supports determining offsets for memory read operations in accordance with examples as disclosed herein.

FIG. 5 illustrates an example of a flow diagram illustrating a method 500 that supports determining offsets for memory read operations in accordance with examples as disclosed herein. The operations of method 500 may be implemented by a memory system or its components as described herein. For example, aspects of the method 500 may be implemented by a controller, among other components. Additionally or alternatively, aspects of the method 500 may be implemented as instructions stored in memory (e.g., firmware stored in a memory coupled with a memory device). For example, the instructions, when executed by a controller (e.g., controller 405), may cause the controller to perform the operations of the method 500. In some examples, a memory system may execute a set of instructions to control the functional elements of the memory system to perform the described functions. Additionally or alternatively, a memory system may perform aspects of the described functions using special-purpose hardware. The method 500 will be discussed with reference to the components shown on FIG. 4.

Using method 500, if a relative quantity of pages fail their initial reads but are successfully read during re-reads using a same reference adjustment, the offset responsible for the adjustment may be used as a baseline offset for initial reads of subsequent pages. And after the baseline offset has started to be used, if the reference adjustment no longer produces successful initial reads, the baseline offset may be modified for initial reads of further pages or cleared so that initial reads of further pages may be performed without adjustment to the reference.

Method 500 may include a first read operation mode 505 and a second read operation mode 510. In first read operation mode 505, initial reads of pages may be performed using a reference voltage. If an uncorrectable error is detected during the initial read of a page, one or more re-reads may be performed on the page using offsets to shift the reference value until the data is read without errors. If re-reads are successfully performed for a threshold quantity of pages using a same offset value, it may indicate that the offset value may be effective for reading subsequent reads. So the method may flow to read operation mode 510 where the offset value may be used as a baseline for further page reads.

In second read operation mode 510, the initial reads of the pages may be performed using the reference voltage with a baseline offset. Similar to first read operation mode 505, if an uncorrectable error is detected during the initial read of a page, one or more re-reads may be performed on the page using offsets until the data is read without errors. If a relative quantity of pages fail their initial reads using the reference adjustment, it may signify that the adjustment may no longer be adequate. In some cases, if that occurs but re-reads are successfully performed for a threshold quantity of pages having a same new offset value (e.g., not the baseline offset), the new offset value may be used as a new baseline for further page reads. In some cases, if no such new offset value is determined, the method may return to first read operation mode 505 to perform initial reads with the reference voltage without the baseline offset.

In method 500, first read operation mode 505 may include one or more of steps 512 through 525 and second read operation mode 510 may include one or more of steps 530 through 555. As shown in FIG. 5, method 500 may flow from first read operation mode 505 to second read operation mode 510 and from second read operation mode 510 back to first read operation mode 505.

At 512, baseline offset register 435 and page offset registers 425 may be cleared (e.g., reset) to indicate an offset value of zero so that the reference voltage may be used without an offset for the initial reads of the pages. In some cases, select re-read offset register 440 may also be cleared. Other registers, counters, and flags may also be initialized. Note that the counters and corresponding thresholds corresponding to the various steps may be different from each other.

At 515, a page may be read by performing a read operation, as generally discussed with reference to FIG. 4. An initial read of the page may be performed using the reference voltage (e.g., as indicated by reference voltage register 430) without an offset (i.e., without being shifted). In some cases, this may be accomplished for the initial read by using the page offset register 425 associated with the page after the page offset register 425 has been initialized to indicate an offset of zero. In other cases, the page offset register 425 may be bypassed (e.g., not used) for the initial read.

If the data obtained from the page during the initial read contains errors, one or more re-reads may be performed on the page using offsets until a successful read (i.e., without an error) has been accomplished, as discussed with reference to FIG. 4. In some cases, select re-read offset register 440 may be used to determine the offset value for the first re-read. In some cases, the select re-read offset value may be updated based on the offset value used at step 515 to successfully read the page.

At 520, it may be determined whether re-reads were performed at 515 to successfully read the page. If the initial read of the page at 515 was unsuccessful (e.g., an error was detected in the initial read) so that one or more re-reads were performed to read the page, the method may continue to 525. Otherwise, the method may return to 515 to read the next page, again using the reference voltage without an offset for the initial read.

At 525, it may be determined whether the offset value used to successfully read the page during the re-read may be equal to an offset value used for a successful re-read of a prior page (e.g., an immediately prior page). In some cases, this may be done by comparing the offset value to a prior offset value indicated by select re-read offset register 440. If the offset values are equal, it may be determined whether a quantity of successful reads using the offset value may have occurred. In some cases, the quantity may be a quantity of consecutive successful reads that have used the offset value. In some cases, it may be determined whether a threshold quantity of read operations in a certain quantity of read operations have successfully used the same offset value.

In some cases, a counter may be updated (e.g., incremented) each time the same offset value is successfully used for re-reads of different pages and compared against a threshold. In some cases, the threshold may be a quantity (e.g., 10) such that the threshold may be met upon the counter reaching the quantity. In some examples, the quantity used as the threshold may be stored in a memory associated with the system (e.g., a predetermined quantity). In some cases, the threshold may be a percentage of the quantity of times the same offset value has been successfully used compared to the quantity of pages that have been read. The counter may be reset upon entering the first read operation mode 505 (e.g., at 512).

If a sufficient quantity of read operations have successfully used the same offset value, it may be determined to use the offset value as a baseline offset and the method may continue to 530 to enter the second read operation mode 510. Otherwise, the method may return to 515 to read the next page using the reference voltage without an offset for the initial read.

At 530, baseline offset register 435 may be updated to include the indication of the offset value to use as a baseline. This may include storing in baseline offset register 435 an indication of the offset value determined at 525 or an indication of the new offset value determined at 545. In some cases, this may be done by copying to baseline offset register 435 the contents of select re-read offset register 440. After baseline offset register 435 has been updated, the value in baseline offset register 435 may be copied to the page offset registers 425 associated with the remaining pages to be read so that the baseline offset value may be used for the initial reads of those pages.

At 535, the next page may be read by performing a read operation, as generally discussed with reference to FIG. 4. But unlike in first read operation mode 505, a baseline offset (e.g., as indicated by baseline offset register 435) may be used with the reference voltage for the initial read of the page. In some cases, this may be accomplished for the initial read by using the page offset register 425 associated with the page after copying the value of baseline offset register 435 to the page offset register. In other cases, baseline offset register 435 may be used instead of the page offset register 425 for the initial read.

If the data obtained from the page during the initial read contains errors, one or more re-reads may be performed on the page using adjusted offsets until a successful read (i.e., without an error) has been accomplished, as discussed with reference to FIG. 4. In some cases, select re-read offset register 440 may be used to determine the offset value for the first re-read (e.g. besides the baseline offset) In some cases, the select re-read offset value may be updated based on the offset value used at step 535 to successfully read the page. In some cases, the offset value used for the first re-read may be set to zero.

At 540, it may be determined whether re-reads were performed at 535 to successfully read the page. If the initial read of the page using the baseline offset was successful (e.g., no error detected), then the method may return to 535 to read the next page, again using the reference voltage with the baseline offset for the initial read. If the initial read of the page at 535 was unsuccessful (e.g., an error was detected in the initial read) so that one or more re-reads were performed to read the page, the method may continue to 545.

At 545, it may be determined whether the new offset value (i.e., not the baseline offset value) used to successfully read the page at 535 during the re-read may be equal to an offset value used for a successful re-read of a prior page (e.g., an immediately prior page). In some cases, this may be done by comparing the new offset value to a prior offset value indicated by select re-read offset register 440. If the offset values are equal, it may be determined whether a sufficient quantity of successful reads using the new offset value may have occurred. In some cases, the quantity may be a quantity of consecutive successful reads that have used the new offset value. In some cases, it may be determined whether a threshold quantity of read operations in a certain quantity of read operations have failed using the baseline offset but have successfully used the new offset value.

In some cases, a counter may be updated (e.g., incremented) each time the new offset value is successfully used for re-reads of different pages and compared against a threshold. In some cases, the threshold may be a quantity (e.g., 10) such that the threshold may be met upon the counter reaching the quantity. In some cases, the threshold may be a percentage of the quantity of times the new offset value has been successfully used compared to the quantity of pages that have been read. The counter may be reset upon entering the second read operation mode 510 or a new baseline is set (e.g., at 530).

If a sufficient quantity of read operations have successfully used the same new offset value (e.g., have met the threshold), it may be determined to use the new offset value as a new baseline offset and the method may return to 530 to replace the baseline value with the new offset value. Otherwise, the method may continue to 555.

At 555, it may be determined whether a threshold quantity of unsuccessful initial reads have occurred using the reference voltage with the baseline offset. For example, it may be determined if a threshold quantity of re-read operations in a certain quantity of read operations have occurred while using the reference voltage with the baseline offset for initial reads.

In some cases, a counter may be updated (e.g., incremented) each time the baseline offset value is unsuccessfully used for an initial read of a page and compared against a threshold. In some cases, the threshold may be a quantity (e.g., 10) such that the threshold may be met upon the counter reaching the quantity. In some cases, the threshold may be a percentage of the quantity of times the new offset value has been unsuccessfully used compared to the quantity of pages that have been read. The counter may be reset upon entering the second read operation mode 510 (e.g., at 530).

If the threshold has been met, the method may return to 512 to reenter the first read operation mode 505 and read the next page using the reference voltage without an offset for the initial read. Otherwise, the method may return to 535 to read the next page using the reference voltage with the baseline offset for the initial read.

In some cases, more than one baseline may be determined and used in method 500. For example, different baseline offsets may be determined and stored for different read voltages for different types of blocks (e.g., SLC, MLC, TLC, etc.). Then, if a baseline offset is to be used, the baseline offset associated with the type of block may be selected. As another example, different baseline offsets may be determined for different temperatures and stored in the system. Then, if a baseline offset is to be used, the temperature of the memory may be determined, and the baseline offset associated with that temperature may be selected.

In some cases, the success or failure of multiple baseline offset values may be monitored in method 500. If a baseline offset is to be used, the value with the highest success rate may be used. Other ways of determining baseline offset values may also be used.

The method described above describes one possible implementation, and that the operations and steps may be rearranged or otherwise modified and that other implementations are possible. For example, step 545 may be omitted so that step 540 may continue directly to 555 if the initial read of the page was unsuccessful. The method would then return to first read operation mode 505 if the baseline offset value was deemed to be inadequate; the baseline offset would not be updated with a new offset value.

Figure 6:
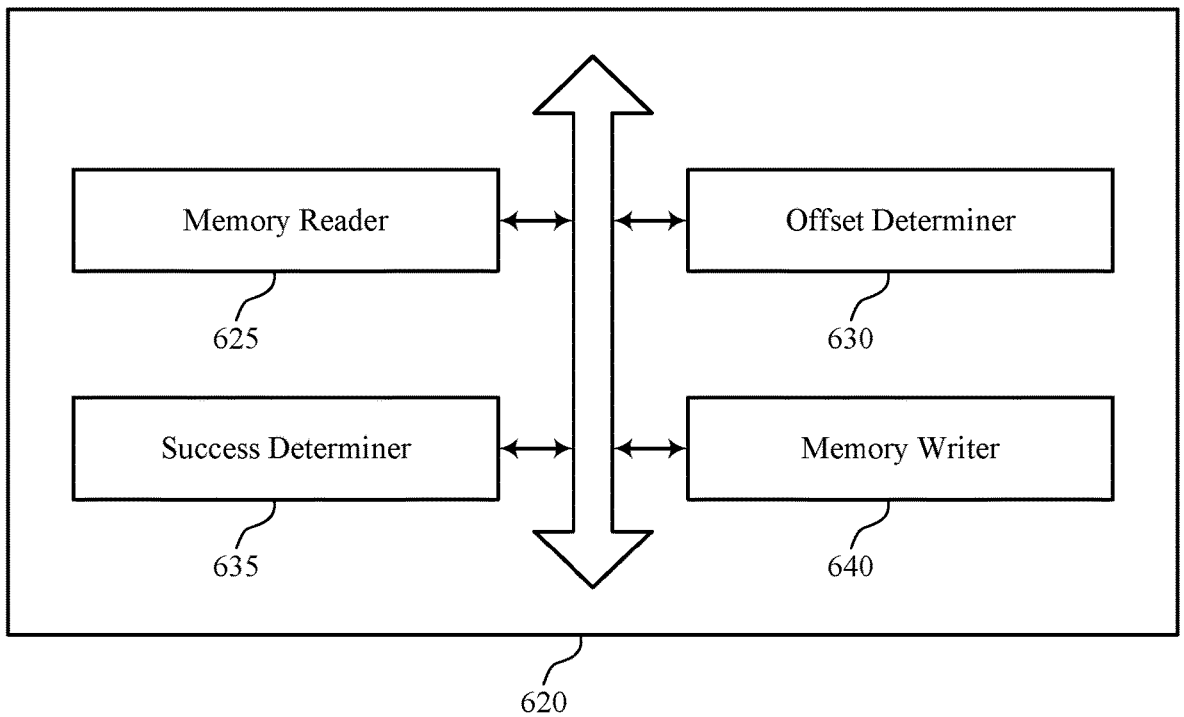
FIG. 6 illustrates a block diagram of a memory system that supports determining offsets for memory read operations in accordance with examples as disclosed herein.

FIG. 6 shows a block diagram 600 of a memory system 620 that supports determining offsets for memory read operations in accordance with examples as disclosed herein. The memory system 620 may be an example of aspects of a memory system as described with reference to FIGS. 1 through 5. The memory system 620, or various components thereof, may be an example of means for performing various aspects of determining offsets for memory read operations as described herein. For example, the memory system 620 may include a memory reader 625, an offset determiner 630, a success determiner 635, a memory writer 640, or any combination thereof. Each of these components may communicate, directly or indirectly, with one another (e.g., via one or more buses).

The memory reader 625 may be configured as or otherwise support a means for performing a first plurality of read operations on a block of a memory array using a reference voltage. The offset determiner 630 may be configured as or otherwise support a means for determining, as part of performing the first plurality of read operations, one or more offset values to use with the reference voltage to perform the first plurality of read operations. In some examples, the offset determiner 630 may be configured as or otherwise support a means for determining a fixed offset value to use as a baseline offset for a second plurality of read operations based at least in part on determining the one or more offset values. In some examples, the memory reader 625 may be configured as or otherwise support a means for performing the second plurality of read operations on the block of the memory array using the reference voltage and the fixed offset value.

In some examples, the success determiner 635 may be configured as or otherwise support a means for determining that a threshold quantity of read operations of the first plurality of read operations are unsuccessful, where determining the fixed offset value may be based at least in part on determining that the threshold quantity of read operations are unsuccessful.

In some examples, the threshold quantity of read operations may include a threshold quantity of consecutive read operations that are unsuccessful.

In some examples, the success determiner 635 may be configured as or otherwise support a means for determining that a threshold quantity of read operations of the first plurality of read operations are successful, where determining the fixed offset value may be based at least in part on determining that the threshold quantity of read operations are successful.

In some examples, the threshold quantity of read operations may include a threshold quantity of consecutive read operations that are successful.

In some examples, the fixed offset value may be based at least in part on the one or more offset values determined as part of the first plurality of read operations.

In some examples, the success determiner 635 may be configured as or otherwise support a means for determining that a threshold quantity of read operations of the second plurality of read operations are unsuccessful. In some examples, the offset determiner 630 may be configured as or otherwise support a means for determining a second fixed offset value to use as the baseline offset for a third plurality of read operations based at least in part on determining that the threshold quantity of read operations are unsuccessful. In some examples, the memory reader 625 may be configured as or otherwise support a means for performing the third plurality of read operations of the block of the memory array using the reference voltage and the second fixed offset value.

In some examples, to support determining the fixed offset value, the offset determiner 630 may be configured as or otherwise support a means for determining an offset value for a read operation of the first plurality of read operations based at least in part on an offset value for a prior read operation of the first plurality of read operations.

In some examples, the fixed offset value may be based at least in part on the one or more offset values.

In some examples, the first plurality of read operations and the second plurality of read operations may each include a read operation of a separate page of the memory array.

In some examples, to support determining the one or more offset values, the success determiner 635 may be configured as or otherwise support a means for determining, during a read operation of the first plurality of read operations, that information retrieved from the memory array includes an error. In some examples, to support determining the one or more offset values, the offset determiner 630 may be configured as or otherwise support a means for adjusting an offset value based at least in part on determining that the information includes the error. In some examples, to support determining the one or more offset values, the memory reader 625 may be configured as or otherwise support a means for re-reading, during the read operation, the information from the memory array using the reference voltage or the adjusted offset value or both. In some examples, to support determining the one or more offset values, the offset determiner 630 may be configured as or otherwise support a means for determining, based at least in part on the re-reading, that the information is accurate based at least in part on re-reading the information.

In some examples, to support performing the first plurality of read operations, the memory reader 625 may be configured as or otherwise support a means for performing a low-density parity check of information retrieved from the memory array as part of a read operation of the first plurality of read operations, where determining the one or more offset values may be based at least in part on performing the low-density parity check.

In some examples, the memory writer 640 may be configured as or otherwise support a means for storing the fixed offset value in a register for use with the second plurality of read operations, where performing the second plurality of read operations may be based at least in part on storing the fixed offset value in the register.

Figure 7:
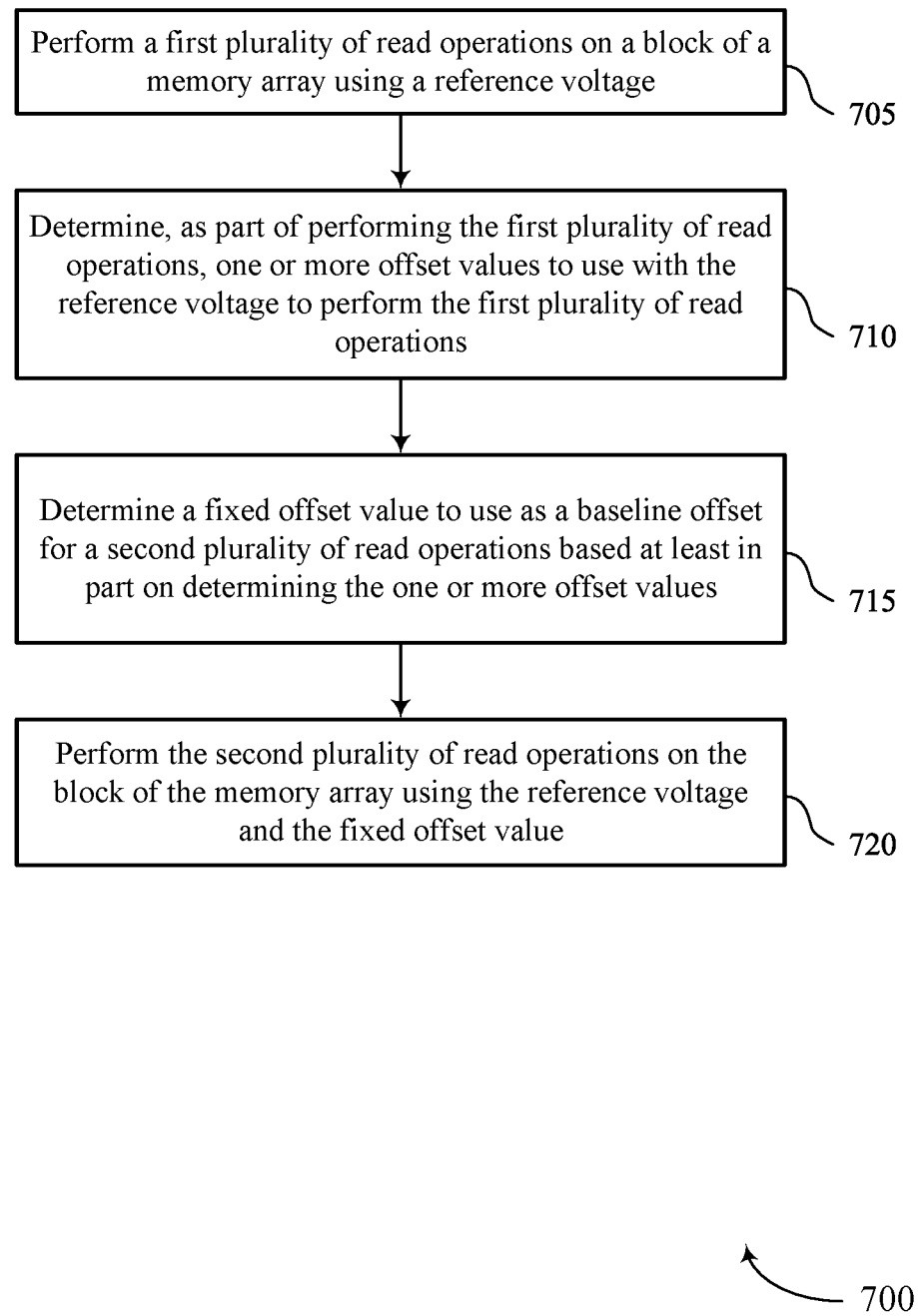
FIG. 7 illustrates a flowchart illustrating a method that supports determining offsets for memory read operations in accordance with examples as disclosed herein.

FIG. 7 shows a flowchart illustrating a method 700 that supports determining offsets for memory read operations in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally or alternatively, the memory system may perform aspects of the described functions using special-purpose hardware.

At 705, the method may include performing a first plurality of read operations on a block of a memory array using a reference voltage. The operations of 705 may be performed in accordance with examples as disclosed herein. In some examples, aspects of the operations of 705 may be performed by a memory reader 625 as described with reference to FIG. 6.

At 710, the method may include determining, as part of performing the first plurality of read operations, one or more offset values to use with the reference voltage to perform the first plurality of read operations. The operations of 710 may be performed in accordance with examples as disclosed herein. In some examples, aspects of the operations of 710 may be performed by an offset determiner 630 as described with reference to FIG. 6.

At 715, the method may include determining a fixed offset value to use as a baseline offset for a second plurality of read operations based at least in part on determining the one or more offset values. The operations of 715 may be performed in accordance with examples as disclosed herein. In some examples, aspects of the operations of 715 may be performed by an offset determiner 630 as described with reference to FIG. 6.

At 720, the method may include performing the second plurality of read operations on the block of the memory array using the reference voltage and the fixed offset value. The operations of 720 may be performed in accordance with examples as disclosed herein. In some examples, aspects of the operations of 720 may be performed by a memory reader 625 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for performing a first plurality of read operations on a block of a memory array using a reference voltage, determining, as part of performing the first plurality of read operations, one or more offset values to use with the reference voltage to perform the first plurality of read operations, determining a fixed offset value to use as a baseline offset for a second plurality of read operations based at least in part on determining the one or more offset values, and performing the second plurality of read operations on the block of the memory array using the reference voltage and the fixed offset value.

Some examples of the method 700 and the apparatus described herein may further include operations, features, circuitry, logic, means, or instructions for determining that a threshold quantity of read operations of the first plurality of read operations may be unsuccessful, where determining the fixed offset value may be based at least in part on determining that the threshold quantity of read operations may be unsuccessful.

In some examples of the method 700 and the apparatus described herein, the threshold quantity of read operations may include a threshold quantity of consecutive read operations that may be unsuccessful.

Some examples of the method 700 and the apparatus described herein may further include operations, features, circuitry, logic, means, or instructions for determining that a threshold quantity of read operations of the first plurality of read operations may be successful, where determining the fixed offset value may be based at least in part on determining that the threshold quantity of read operations may be successful.

In some examples of the method 700 and the apparatus described herein, the threshold quantity of read operations may include a threshold quantity of consecutive read operations that may be successful.

In some examples of the method 700 and the apparatus described herein, the fixed offset value may be based at least in part on the one or more offset values determined as part of the first plurality of read operations.

Some examples of the method 700 and the apparatus described herein may further include operations, features, circuitry, logic, means, or instructions for determining that a threshold quantity of read operations of the second plurality of read operations may be unsuccessful, determining a second fixed offset value to use as the baseline offset for a third plurality of read operations based at least in part on determining that the threshold quantity of read operations may be unsuccessful, and performing the third plurality of read operations of the block of the memory array using the reference voltage and the second fixed offset value.

In some examples of the method 700 and the apparatus described herein, determining the fixed offset value may include operations, features, circuitry, logic, means, or instructions for determining an offset value for a read operation of the first plurality of read operations based at least in part on an offset value for a prior read operation of the first plurality of read operations.

In some examples of the method 700 and the apparatus described herein, the fixed offset value may be based at least in part on the one or more offset values.

In some examples of the method 700 and the apparatus described herein, the first plurality of read operations and the second plurality of read operations each may include a read operation of a separate page of the memory array.

In some examples of the method 700 and the apparatus described herein, determining the one or more offset values may include operations, features, circuitry, logic, means, or instructions for determining, during a read operation of the first plurality of read operations, that information retrieved from the memory array includes an error, adjusting an offset value based at least in part on determining that the information includes the error, re-reading, during the read operation, the information from the memory array using the reference voltage and the adjusted offset value, and determining, based at least in part on the re-reading, that the information may be accurate based at least in part on re-reading the information.

In some examples of the method 700 and the apparatus described herein, performing the first plurality of read operations may include operations, features, circuitry, logic, means, or instructions for performing a low-density parity check of information retrieved from the memory array as part of a read operation of the first plurality of read operations, where determining the one or more offset values may be based at least in part on performing the low-density parity check.

Some examples of the method 700 and the apparatus described herein may further include operations, features, circuitry, logic, means, or instructions for storing the fixed offset value in a register for use with the second plurality of read operations, where performing the second plurality of read operations may be based at least in part on storing the fixed offset value in the register.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed, and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed, and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily doped, e.g., degenerate, semiconductor region. The source and drain may be separated by a lightly doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory array; and
   a controller coupled with the memory array and configured to cause the apparatus to:
   perform a first plurality of read operations on a block of the memory array using a reference voltage;
   determine, as part of performing the first plurality of read operations, one or more offset values to use with the reference voltage to perform the first plurality of read operations;
   determine a fixed offset value to use as a baseline offset for a second plurality of read operations based at least in part on determining the one or more offset values; and
   perform the second plurality of read operations on the block of the memory array using the reference voltage and the fixed offset value.

2. The apparatus of claim 1, wherein the controller is further configured to cause the apparatus to:
   determine that a threshold quantity of read operations of the first plurality of read operations are unsuccessful, wherein determining the fixed offset value is based at least in part on determining that the threshold quantity of read operations are unsuccessful.

3. The apparatus of claim 2, wherein the threshold quantity of read operations comprises a threshold quantity of consecutive read operations that are unsuccessful.

4. The apparatus of claim 1, wherein the controller is further configured to cause the apparatus to:
   determine that a threshold quantity of read operations of the first plurality of read operations are successful, wherein determining the fixed offset value is based at least in part on determining that the threshold quantity of read operations are successful.

5. The apparatus of claim 4, wherein the threshold quantity of read operations comprises a threshold quantity of consecutive read operations that are successful.

6. The apparatus of claim 4, wherein the fixed offset value is based at least in part on the one or more offset values determined as part of the first plurality of read operations.

7. The apparatus of claim 1, wherein the controller is further configured to cause the apparatus to:
   determine that a threshold quantity of read operations of the second plurality of read operations are unsuccessful;
   determine a second fixed offset value to use as the baseline offset for a third plurality of read operations based at least in part on determining that the threshold quantity of read operations are unsuccessful; and
   perform the third plurality of read operations of the block of the memory array using the reference voltage and the second fixed offset value.

8. The apparatus of claim 1, wherein to determine the fixed offset value, the controller is further configured to cause the apparatus to:
   determine an offset value for a read operation of the first plurality of read operations based at least in part on an offset value for a prior read operation of the first plurality of read operations.

9. The apparatus of claim 1, wherein the fixed offset value is based at least in part on the one or more offset values.

10. The apparatus of claim 1, wherein the first plurality of read operations and the second plurality of read operations each comprise a read operation of a separate page of the memory array.

11. The apparatus of claim 1, wherein to determine the one or more offset values, the controller is further configured to cause the apparatus to:
    determine, during a read operation of the first plurality of read operations, that information retrieved from the memory array includes an error;

adjust an offset value based at least in part on determining that the information includes the error;
re-read, during the read operation, the information from the memory array using the reference voltage and the adjusted offset value; and
determine, based at least in part on the re-reading, that the information is accurate based at least in part on re-reading the information.

12. The apparatus of claim 1, wherein to perform the first plurality of read operations, the controller is further configured to cause the apparatus to:
perform a low-density parity check of information retrieved from the memory array as part of a read operation of the first plurality of read operations, wherein determining the one or more offset values is based at least in part on performing the low-density parity check.

13. The apparatus of claim 1, wherein the controller is further configured to cause the apparatus to:
store the fixed offset value in a register for use with the second plurality of read operations, wherein performing the second plurality of read operations is based at least in part on storing the fixed offset value in the register.

14. A non-transitory computer-readable medium storing code comprising instructions which, when executed by a processor of an electronic device, cause the electronic device to:
perform a first plurality of read operations on a block of a memory array using a reference voltage;
determine, as part of performing the first plurality of read operations, one or more offset values to use with the reference voltage to perform the first plurality of read operations;
determine a fixed offset value to use as a baseline offset for a second plurality of read operations based at least in part on determining the one or more offset values; and
perform the second plurality of read operations on the block of the memory array using the reference voltage and the fixed offset value.

15. The non-transitory computer-readable medium of claim 14, wherein the instructions, when executed by the processor of the electronic device, further cause the electronic device to:
determine that a threshold quantity of read operations of the first plurality of read operations are unsuccessful, wherein determining the fixed offset value is based at least in part on determining that the threshold quantity of read operations are unsuccessful.

16. The non-transitory computer-readable medium of claim 14, wherein the instructions, when executed by the processor of the electronic device, further cause the electronic device to:
determine that a threshold quantity of read operations of the first plurality of read operations are successful, wherein determining the fixed offset value is based at least in part on determining that the threshold quantity of read operations are successful.

17. The non-transitory computer-readable medium of claim 14, wherein the instructions, when executed by the processor of the electronic device, further cause the electronic device to:
determine that a threshold quantity of read operations of the second plurality of read operations are unsuccessful;
determine a second fixed offset value to use as the baseline offset for a third plurality of read operations based at least in part on determining that the threshold quantity of read operations are unsuccessful; and
perform the third plurality of read operations of the block of the memory array using the reference voltage and the second fixed offset value.

18. The non-transitory computer-readable medium of claim 14, wherein to determine the one or more offset values, the instructions, when executed by the processor of the electronic device, further cause the electronic device to:
determine an offset value for a read operation of the first plurality of read operations based at least in part on an offset value for a prior read operation of the first plurality of read operations.

19. The non-transitory computer-readable medium of claim 14, wherein the fixed offset value is based at least in part on the one or more offset values.

20. The non-transitory computer-readable medium of claim 14, wherein to determine the one or more offset values, the instructions, when executed by the processor of the electronic device, further cause the electronic device to:
determine, during a read operation of the first plurality of read operations, that information retrieved from the memory array includes an error;
adjust an offset value based at least in part on determining that the information includes the error;
re-read, during the read operation, the information from the memory array using the reference voltage and the adjusted offset value; and
determine, based at least in part on the re-reading, that the information is accurate based at least in part on re-reading the information.

21. A method performed by a memory system, comprising:
performing a first plurality of read operations on a block of a memory array using a reference voltage;
determining, as part of performing the first plurality of read operations, one or more offset values to use with the reference voltage to perform the first plurality of read operations;
determining a fixed offset value to use as a baseline offset for a second plurality of read operations based at least in part on determining the one or more offset values; and
performing the second plurality of read operations on the block of the memory array using the reference voltage and the fixed offset value.

22. The method of claim 21, further comprising:
determining that a threshold quantity of read operations of the first plurality of read operations are unsuccessful, wherein determining the fixed offset value is based at least in part on determining that the threshold quantity of read operations are unsuccessful.

23. The method of claim 21, further comprising:
determining that a threshold quantity of read operations of the first plurality of read operations are successful, wherein determining the fixed offset value is based at least in part on determining that the threshold quantity of read operations are successful.

24. The method of claim 21, further comprising:
determining that a threshold quantity of read operations of the second plurality of read operations are unsuccessful;
determining a second fixed offset value to use as the baseline offset for a third plurality of read operations based at least in part on determining that the threshold quantity of read operations are unsuccessful; and performing the third plurality of read operations of the block of the memory array using the reference voltage and the second fixed offset value.

25. The method of claim 21, wherein determining the one or more offset values comprises:

determining, during a read operation of the first plurality of read operations, that information retrieved from the memory array includes an error;

adjusting an offset value based at least in part on determining that the information includes the error;

re-reading, during the read operation, the information from the memory array using the reference voltage and the adjusted offset value; and determining, based at least in part on the re-reading, that the information is accurate based at least in part on re-reading the information.

* * * * *